(12) United States Patent
Kwon et al.

(10) Patent No.: US 7,671,692 B2
(45) Date of Patent: Mar. 2, 2010

(54) APPARATUS AND METHOD FOR COMPENSATING CARRIER FEEDTHROUGH IN QUADRATURE MODULATION SYSTEM

(75) Inventors: Heon Kook Kwon, Daejeon (KR); Joon Hyung Kim, Daejeon (KR); Byung Su Kang, Daejeon (KR); Kwang Chun Lee, Daejeon (KR)

(73) Assignees: Electronics and Telecommunications Research Institute, Daejeon (KR); Samsung Electronics Co., Ltd., Suwon-si (KR)

( * ) Notice: Subject to any disclaimer, the term of this patent is extended or adjusted under 35 U.S.C. 154(b) by 99 days.

(21) Appl. No.: 12/170,715

(22) Filed: Jul. 10, 2008

(65) Prior Publication Data

US 2009/0140821 A1   Jun. 4, 2009

(30) Foreign Application Priority Data

Dec. 4, 2007   (KR) ...................... 10-2007-0125060

(51) Int. Cl.
*H03C 3/00*   (2006.01)
*H04L 27/20*   (2006.01)

(52) U.S. Cl. ...................... 332/103; 332/144; 375/308; 455/110

(58) Field of Classification Search ......... 332/103–105, 332/144–148; 375/298, 308; 455/110
See application file for complete search history.

(56) References Cited

U.S. PATENT DOCUMENTS

| 5,012,208 A | 4/1991 | Makinen et al. |
| 5,396,196 A | 3/1995 | Blodgett |
| 7,603,096 B2* | 10/2009 | Chung et al. ................. 455/262 |
| 2006/0208820 A1 | 9/2006 | Parsa et al. |

FOREIGN PATENT DOCUMENTS

| KR | 10-2001-0071305 A | 7/2001 |
| KR | 10-0382086 B1 | 4/2003 |
| KR | 10-2006-0009266 A | 1/2006 |

* cited by examiner

*Primary Examiner*—David Mis
(74) *Attorney, Agent, or Firm*—Jefferson IP Law, LLP

(57) ABSTRACT

The present invention relates to an apparatus and a method for compensating carrier feedthrough in a quadrature modulation system. In order to suppress the carrier feedthrough, and minimize and compensate the carrier feedthrough, differences of baseband differential input DC voltages in an in-phase as well as a quadrature-phase are simultaneously adjusted to 0 or a certain slight voltage difference by a simple analog circuit. Therefore, it is possible to suppress carrier feedthrough using a simple analog type apparatus for compensating carrier feedthrough, and simply achieve an apparatus for carrier feedthrough using a variety of quadrature modulators.

14 Claims, 4 Drawing Sheets

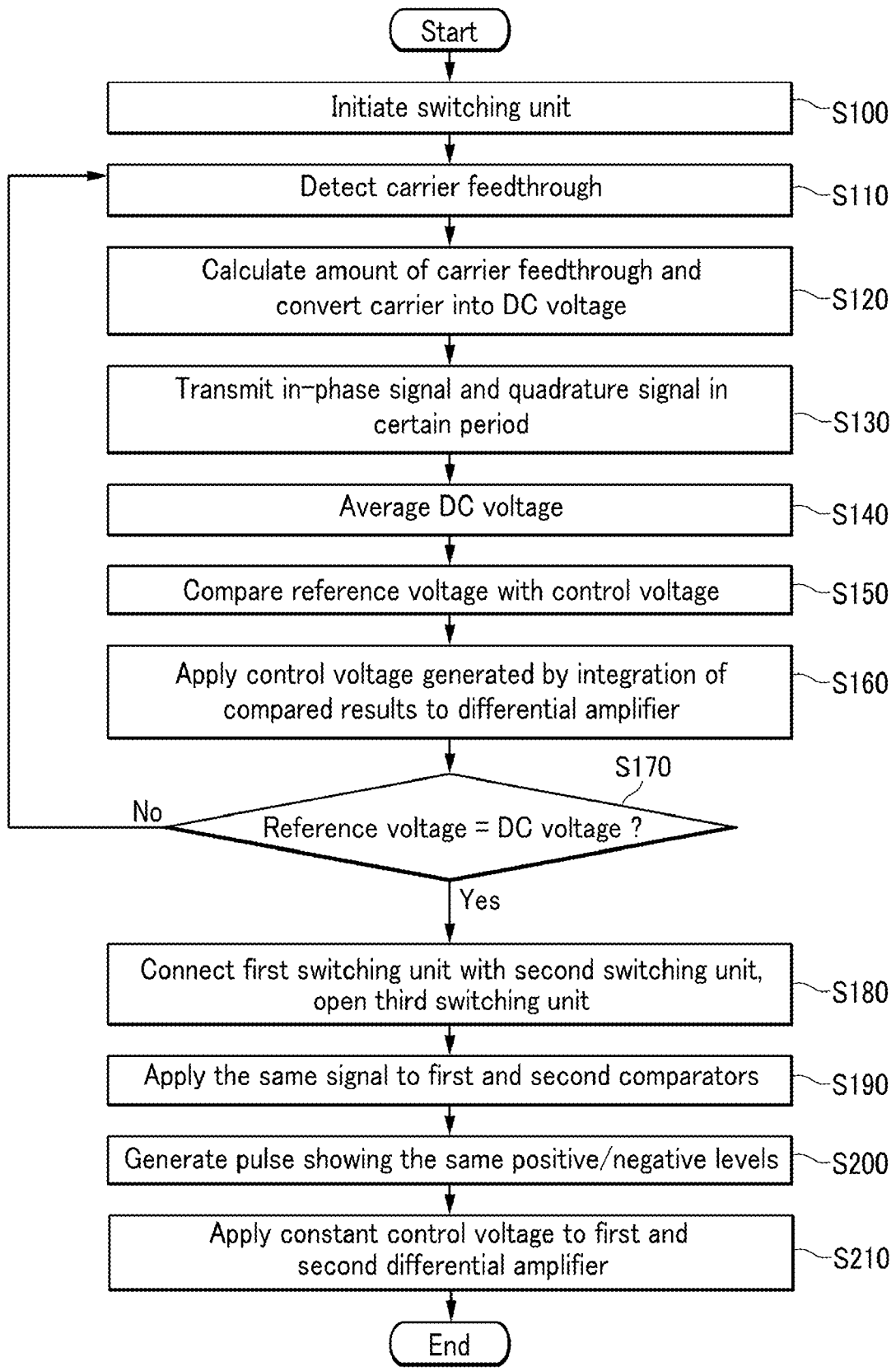

APPARATUS AND METHOD FOR COMPENSATING CARRIER FEEDTHROUGH IN QUADRATURE MODULATION SYSTEM

CROSS-REFERENCE TO RELATED APPLICATION

This application claims priority to and the benefit of Korean Patent Application No. 10-2007-0125060 filed in the Korean Intellectual Property Office on Dec. 4, 2007, the entire contents of which are incorporated herein by reference.

BACKGROUND OF THE INVENTION (a) Field of the Invention

The present invention relates to an apparatus and a method for compensating carrier feedthrough in a quadrature modulator and a quadrature modulation system.

(b) Description of the Related Art

In general, an ideal voltage difference in a quadrature modulator is considered to be when the DC voltage difference of a baseband differential input is 0, since this prevents carrier feedthrough. However, the DC voltage difference of the baseband differential input in the quadrature modulator is not substantially 0, and this causes carrier feedthrough due to mixing with a local oscillator signal.

Currently, carrier feedthrough occurs even in a quadrature modulator used in a system using quadrature modulation, the carrier feedthrough being caused by the DC voltage difference of a baseband differential input. The carrier feedthrough occurs differently as various types of the quadrature modulators. For example, there are quadrature modulators of which the carrier feedthrough is at the minimum when the DC voltage difference is 0, whereas there are quadrature modulators of which the carrier feedthrough is at the minimum when a slight DC voltage difference appears.

A digital compensating circuit has been used in the related art to suppress the carrier feedthrough. In more detail, it detects a carrier feedthrough first, digital circuit compensating carrier feedthrough is activated by comparator and the carrier feedthrough is compensated by a DC compensation signal through a digital-to-analog converter. However, according to the above method, because a number of digital blocks, i.e., constituent elements including a comparator, a digital-analog converter, a control signal generator, etc., in addition to the quadrature modulator are needed, the configuration of the system becomes complicated.

Another method has been disclosed in the related art that detects a DC voltage error in an in-phase/quadrature-phase input in a modulator, and then compensates carrier feedthrough using a bias current of a transistor that performs a modulating operation. However, this method can be applied to only the design of a quadrature modulator.

Another method has been disclosed in the related art that suppresses carrier feedthrough at in-phase/quadrature-phase using a correlator, an integrator, and a pseudo-noise generator on a feedback path. However, the configuration is too complicated to implement a device that suppresses carrier according to this method.

SUMMARY OF THE INVENTION

The present invention has been made in an effort to provide an apparatus for compensating carrier feedthrough that is generated by a modulator output or a transmitter's output in a quadrature modulation system.

Further, the present invention provides a method of adjusting a DC voltage difference using the apparatus for compensating carrier feedthrough.

In order to accomplish the technical objects of the invention, an apparatus for compensating carrier feedthrough in a modulation system, includes: a quadrature modulator that outputs carrier feedthrough signals generated by a difference between a first bias voltage and a first control voltage in an in-phase path and a difference between a second bias voltage and a second control voltage in a quadrature-phase; a coupler that extracts a portion of the carrier feedthrough signals from the quadrature modulator; a detector that measures the amount of carrier feedthrough by detecting the magnitude of the extracted carrier feedthrough signals and converts the carrier feedthrough signals into a DC signal; and controllers that output the first control voltage and the second control voltage, respectively, by comparing the output DC signal with the first reference voltage and the second reference voltage.

In order to accomplish the technical objects of the invention, a method of compensating carrier feedthrough in a quadrature modulation system includes: detecting a carrier feedthrough signal with respect to an in-phase path and a quadrature-phase path on the basis of a first bias voltage and a second bias voltage; calculating the amount of carrier feedthrough signal and converting the carrier feedthrough signal into a DC voltage; alternately outputting the DC voltage in a predetermined period; outputting any one of the DC voltages that are alternately output after removing the periodicity of the DC voltage; comparing the DC voltage with the periodicity removed with the first reference voltage and the second reference voltage, and generating the first control voltage and the second control voltage from the compared results; determining whether a DC voltage with respect to the detected carrier feedthrough signal agrees with a first reference voltage and with a second reference voltage; switching the path to apply the same reference voltages to a comparator while blocking a feedback signal, when the DC voltage agrees with the first reference voltage and the second reference voltage; and generating the first control voltage and the second control voltage using the same reference voltage, and applying the generated first control voltage and second control voltage to a signal in the in-phase path and a signal in the quadrature-phase path, respectively.

BRIEF DESCRIPTION OF THE DRAWINGS

FIG. 4 is a flowchart illustrating a method of compensating carrier feedthrough according to an exemplary embodiment of the present invention.

DETAILED DESCRIPTION OF THE EMBODIMENTS

Figure 1:
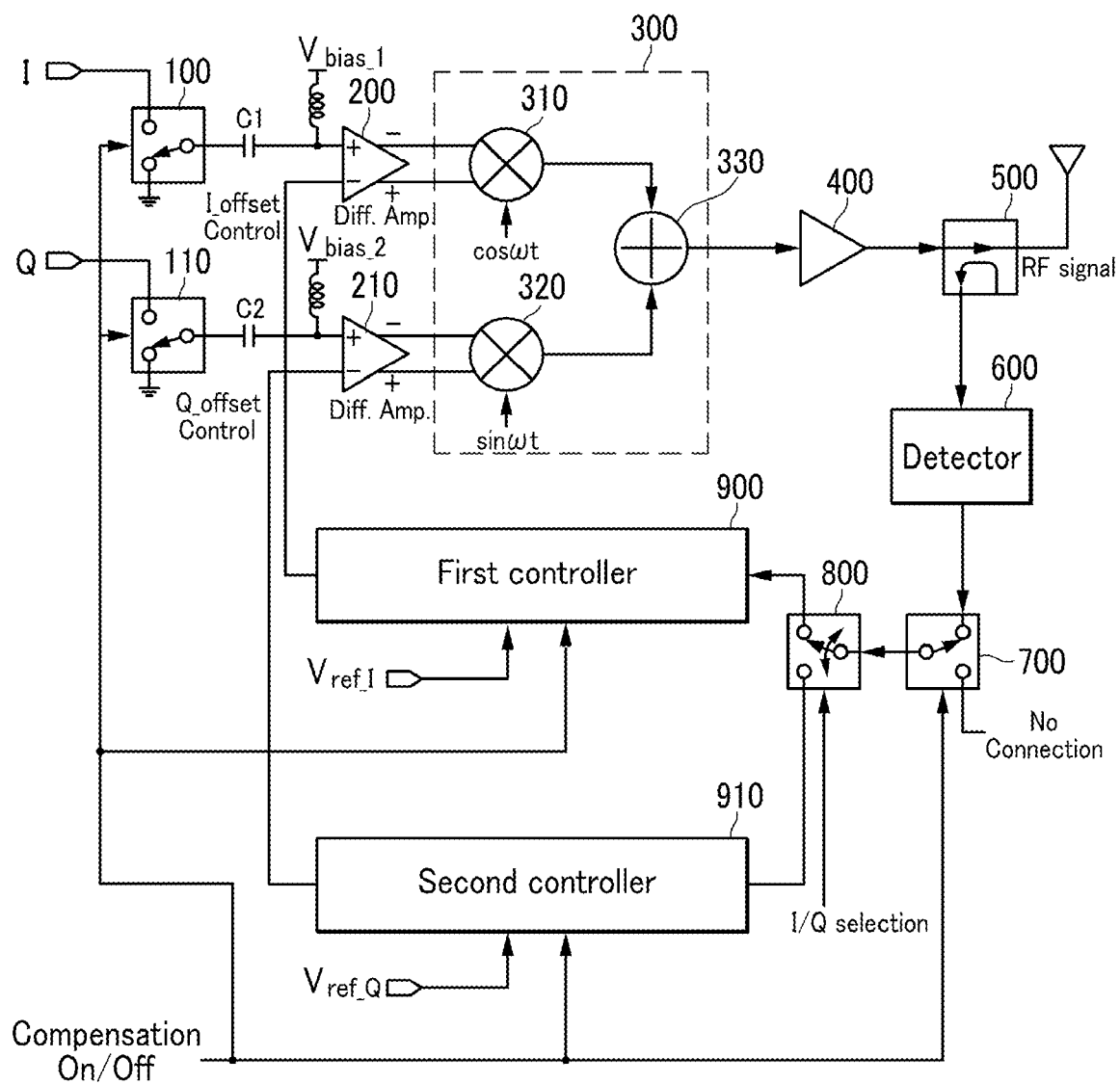
FIG. 1 is a diagram illustrating the configuration of an apparatus for compensating carrier feedthrough according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

It will be further understood that the terms "comprises" and/or "comprising", when used in this specification, specify the presence of stated components, but do not preclude the presence or addition of one or more other components, unless specifically stated. In addition, the terms "-er", "-or" and "module" described in the specification mean units for processing at least one function and operation and can be implemented by hardware components or software components, and combinations thereof.

Throughout this specification and the claims that follow, when it is described that an element is "coupled" to another element, the element may be "directly coupled" to the other element or "electrically coupled" to the other element through a third element.

FIG. 1 is a diagram illustrating the configuration of an apparatus for compensating carrier feedthrough according to an exemplary embodiment of the present invention.

As shown in FIG. 1, an apparatus for compensating carrier feedthrough includes a plurality of switching units 100, 110, 700, and 800, a first differential amplifier 200, a second differential amplifier 210, a quadrature modulator 300, a power amplifier 400, a coupler 500, a detector 600, a first controller 900, and a second controller 910.

First, the plurality of switching units 100, 110, 700, and 800 integrally means a first switching unit to a fourth switching unit. The first switching unit 100 switches a path between grounding and an in-phase signal baseband signal by control of a compensation signal (compensation on/off), and the second switching unit switches a path between grounding and a quadrature-phase signal of the baseband signal by control of a compensation signal.

In detail, when an on-state compensation control signal is input, the first switching unit 100 and the second switching unit 110 are grounded, and when an off-state compensation control signal is input, the first switching unit 100 and the second switching unit 110 are connected such that they can receive an in-phase baseband signal and a quadrature-phase baseband signal, respectively.

Further, the third switching unit 700 switches a carrier feedthrough signal detected by the detector 600 to the first controller 900 and the second controller 910 by control of a compensation control signal. The carrier feedthrough signal is a signal converted into a DC voltage. In detail, when an on-state compensation control signal is input, a carrier feedthrough signal is input to the first controller 900 and the second controller 910, and when an off-state compensation control signal is input, a carrier feedthrough signal is not input.

The fourth switching unit 800 periodically or sequentially transmits a DC voltage with respect to a carrier feedthrough signal to the first controller 900 and the second controller 910. A selection signal (I/Q selection) about whether to control the carrier feedthrough with respect to the signal of the in-phase path or control the carrier feedthrough with respect to the signal of the quadrature-phase is input in a certain period. The switching units are achieved by switches in the exemplary embodiment of the present invention, but are not limited thereto.

The first differential amplifier 200 and the second differential amplifier 210 respectively supply a first bias voltage (Vbias_1) and a second bias voltage (Vbias_2), and a first control voltage (I_offset control) and a second control voltage (Q_offset control), which are respectively output from the first controller 900 and the second controller 910, to the quadrature modulator 300. Further, the first differential amplifier 200 and the second differential amplifier 210 function as modulators, for in-phase/quadrature-phase baseband signals output from the first switching unit 100 and the second switching unit 110 by control of an off-compensation control signal.

The quadrature modulator 300 includes a first mixer 310, a second mixer 320, and an adder 330. The quadrature modulator 300 outputs, as quadrature modulation signals, an in-phase baseband signal and a quadrature-phase baseband signal having a phase difference of 90° in response to in-phase/quadrature-phase baseband signals output from the first differential amplifier 200 and the second differential amplifier 210.

The DC voltage difference of a differential input of each of in-phase/quadrature-phase baseband signals input to the quadrature modulator 300 is input to the first mixer 310 and the second mixer 320, and mixed with local oscillator signals (cos ω t and sin ω t), respectively. Accordingly, limited carrier feedthrough is caused in a radio frequency path. The functions of the first mixer 310, the second mixer 320, and the adder 330 are already known, and are not described in the exemplary embodiment of the present invention.

The power amplifier 400 receives a feedthrough carrier output from quadrature modulator 300, amplifies the power, and then transmits the carrier to an antenna.

The coupler 500 is disposed between the power amplifier 400 and the antenna and extracts a portion of the carrier signal, which is amplified by the amplifier 400 and transmitted to the antenna through a transmission signal path, from the transmission signal path. The carrier signal is composed of a quadrature-phase signal and an in-phase signal.

The signal extracted by the coupler 500 is input to the detector 600. In other words, the coupler 500 extracts a carrier feedthrough signal from the transmission signal path such that the detector 600 can detect the carrier feedthrough signal, a radio frequency signal.

The detector 600 measures the amount of carrier feedthrough by detecting the magnitude of the carrier extracted by the coupler 500. The detected carrier feedthrough signal is converted into a DC voltage.

The first controller 900 and the second controller 910 periodically or sequentially receive the detected carrier feedthrough signal from the fourth switching unit 800 and output a control voltage for adjusting a voltage difference generated between the in-phase signal and the quadrature-phase signal. The first controller 900 and the second controller 910 compare the received carrier feedthrough signal with the first reference voltage (Vref_I) and the second reference voltage (Vref_Q), respectively.

The first reference voltage (Vref_I) and the second reference voltage (Vref_Q) respectively mean a differential DC error voltage of an in-phase baseband input signal and a differential DC error voltage of a quadrature-phase baseband input signal for minimizing the carrier feedthrough. The first reference voltage (Vref_I) and the second reference voltage (Vref_Q) can be changed according to the system design because they depend on characteristics of the component elements.

Next, the configuration of the first controller 900 and the second controller 910 illustrated in FIG. 1 is described with reference to FIG. 2.

Figure 2:
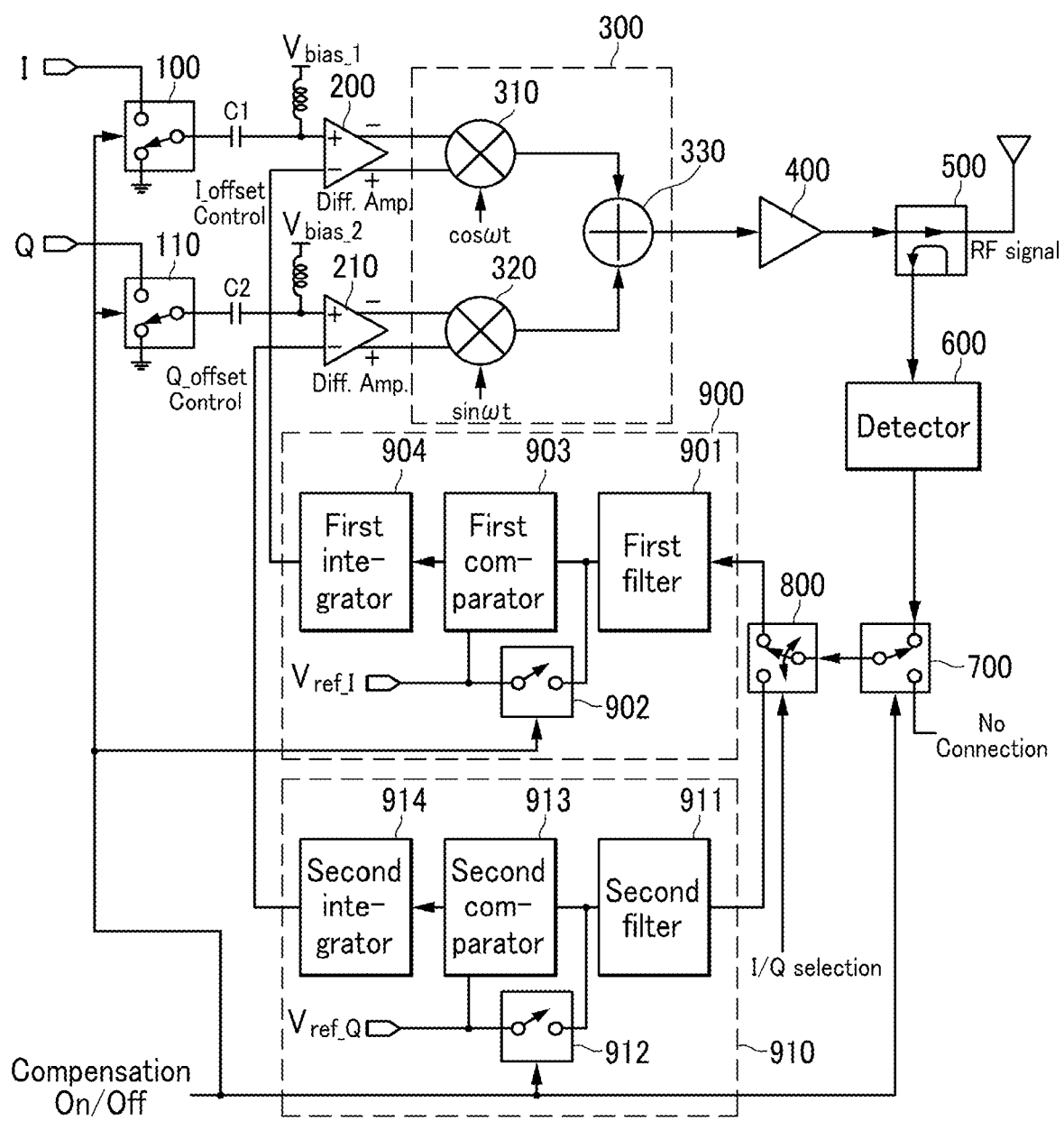
FIG. 2 is a diagram illustrating the detailed configuration of an apparatus for compensating carrier feedthrough according to an exemplary embodiment of the present invention.

FIG. 2 is a diagram illustrating the detailed configuration of an apparatus for compensating carrier feedthrough according to an exemplary embodiment of the present invention.

As shown in FIG. 2, the first controller 900 and the second controller 910 may have two different types of configurations. For example, there are a method of sequentially and alternately performing in-phase/quadrature-phase control and a method of time-divisionally performing in-phase/quadrature-phase control.

The method of time-divisionally performing in-phase/quadrature-phase control is described in the exemplary embodiment of the present invention. Describing control of in-phase/quadrature-phase signals according to this method, the first controller 900 includes a first filter 901, a fifth switching unit 902, a first comparator 903, and a first integrator 904. Further, the second controller 910 includes a second filter 911, a sixth switching unit 912, a second comparator 913, and a second integrator 914.

First, the first filter 901 receives a DC voltage with respect to a carrier feedthrough signal output from the fourth switching unit 800 and the second filter 911 averages a DC voltage transmitted in a certain period in response to a carrier feedthrough signal output from the fourth switching unit 800. The first filter 901 and the second filter 911 may be RC filters, but the first filter 901 and the second filter 911 are used only when an RC time constant is larger than the time-division period. The DC voltage with respect to the carrier feedthrough signal that is input to the first filter 901 and the second filter 911 is input to only one of the filters, depending on switching of the fourth switching unit 800.

The fifth switching unit 902 and the sixth switching unit 912 receive the carrier feedthrough signal averaged by the first filter 901 and the second filter 911 when an on-state compensate control signal is applied, and the first reference voltage (Vref_I) and the second reference voltage (Vref_Q) are applied to the first comparator 903 and the second comparator 913, respectively.

The first comparator 903 and the second comparator 913 each receive the carrier feedthrough signal detected by the detector 600 and then compare the carrier feedthrough signal with the first reference voltage (Vref_I) and the second reference voltage (Vref_Q). The first reference voltage (Vref_I) and the second reference voltage (Vref_Q) mean a differential DC error voltage of an in-phase baseband input signal and a differential DC error voltage of a quadrature-phase baseband input signal for minimizing the carrier feedthrough.

The first integrator 904 and the second integrator 914 respectively receive compared values output from the first comparator 903 and the second comparator 913, that is, a difference value of the DC voltage of the carrier feedthrough signal and the first reference voltage (Vref_I), and a difference value of the DC voltage of the carrier feedthrough signal and the second reference voltage (Vref_Q), and then accumulate and output the difference values. The accumulated values are respectively input to the first differential amplifier 200 and the second differential amplifier 210 illustrated in FIG. 1. The differential DC voltage of the baseband input that minimizes the amount of the carrier feedthrough may be set to 0 or a certain level by the first reference voltage (Vref_I) and the second reference voltage (Vref_Q).

Figure 3:
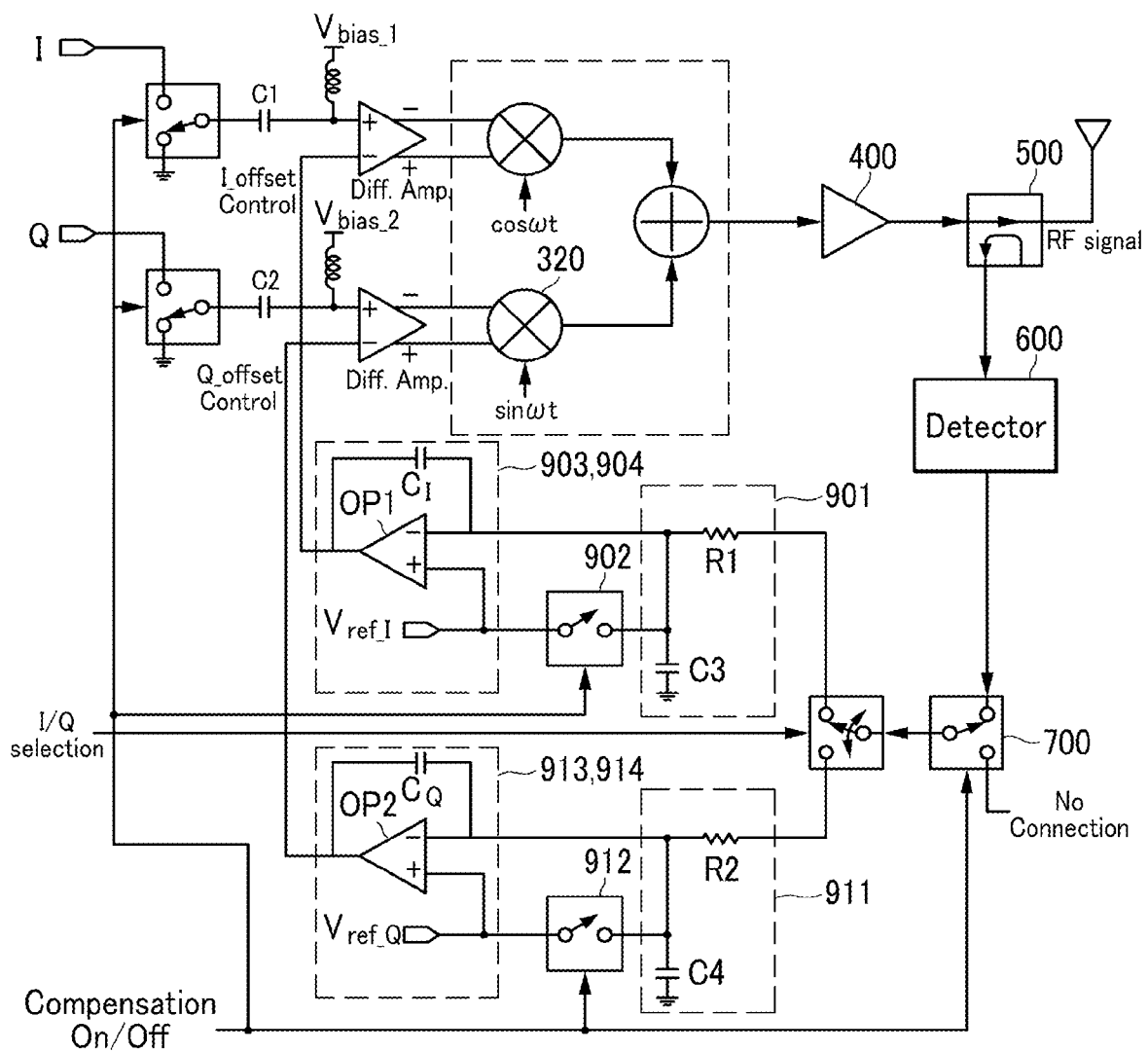
FIG. 3 is a circuit diagram of an apparatus for compensating carrier feedthrough according to an exemplary embodiment of the present invention.

Next, a circuit for achieving the first controller and the second controller illustrated in FIG. 2 is described hereafter with reference to FIG. 3.

FIG. 3 is a circuit diagram of an apparatus for compensating carrier feedthrough according to an exemplary embodiment of the present invention.

As shown in FIG. 3, the first filter 901 and the second filter 911 are each achieved by resistors R1 and R2 and condensers C3 and C4, respectively. Further, the first and second comparators 903 and 913, and the first and second integrators 904 and 914 are each achieved by using one operation amplifier OP1 and OP2, respectively.

First ends of the resistors R1 and R2 are connected to the output terminal of the fourth switching unit 800 and second ends of the resistors R1 and R2 are connected with the input terminals of the operation amplifiers OP1 and OP2. Further, the second ends of the resistors R1 and R2 are connected with the condensers C3 and C4, and the other sides of the condensers C3 and C4 are grounded.

In the exemplary embodiment of the present invention, the comparator and the integrator are achieved by one operation amplifier, but are not limited thereto. One input terminal of the operation amplifier is connected with the output terminal of the filter, and a reference voltage is input to the other terminal of the operation filter.

Next, a method of compensating carrier feedthrough using the apparatus for compensating carrier feedthrough having the above configuration is described hereafter with reference to FIG. 4. The operation for compensating the carrier feedthrough may be performed once at an early stage of operation of a system, or every time there is no signal input to the apparatus.

FIG. 4 is a flowchart illustrating a method of compensating carrier feedthrough according to an exemplary embodiment of the present invention.

As shown in FIG. 4, first, a plurality of switching units is initialized to compensate carrier feedthrough (S100). In the exemplary embodiment of the present invention, in order to compensate the carrier feedthrough, by applying an on-state compensation control signal, the first switching unit 100 and the second switching unit 110 are grounded such that in-phase/quadrature-phase baseband input signals are not input, and the fifth switching unit 902 and the sixth switching unit 912 are opened. Further, the third switching unit 700 is connected to the fourth switching unit 600 such that the carrier feedthrough signal is input to a feedback circuit, the fourth switching unit 800 is set such that an in-phase signal and a quadrature-phase signal that are carrier feedthrough signals are input in a predetermined certain period into the first controller 900 and the second controller 910.

Because the in-phase/quadrature-phase input switches of the first switching unit 100 and the second switching unit 110 are grounded, only the first bias voltage (Vbias_1) and the second bias voltage (Vbias_2) are input to the first differential amplifier 200 and the second differential amplifier 210 at the early state and compared with a predetermined initial level of voltage. Further, on the basis of the bias voltage input at the initial state, after control voltages are calculated by the first controller 900 and the second controller 910, not only the bias voltage but also the first control voltage (I_offset Control) and the second control voltage (Q_offset Control) are respectively input to the first differential amplifier 200 and the second differential amplifier 210, and are transmitted to the quadrature modulator 300 through the differential amplifiers 200 and 210.

The quadrature modulator 300 modulates the carrier feedthrough signals created by the differences between the first bias voltage (Vbias_1) and the second bias voltage (Vbias_2) and the first control voltage (I_offset Control) and the second control voltage (Q_offset Control) into radio frequency signals and then outputs them to the power amplifier 400. The feedthrough carrier is amplified by the power amplifier 400 and input to the coupler 500. The process for the above operation is already known in the art and so is not described in the exemplary embodiment of the present invention.

The coupler 500 not only transmits the signal output from the quadrature modulator 300 to the antenna, but also extracts a portion of the power of the signal. A portion of the power of the feedthrough carrier output from the quadrature modulator 300 is extracted in this embodiment (S110). The carrier feedthrough signal extracted from the coupler 500 is input to the detector 600 and the detector 600 estimates the amount of the input carrier feedthrough signal and then converts the estimated amount into a DC voltage (S120). Thereafter, the detector 600 outputs the converted DC voltage to the third switching unit 700 that transmits the converted DC voltage to the feedback circuit.

As already set in the step S100, since the third switching unit 700 is connected, the DC voltage input to the third switching unit 700 is transmitted to the fourth switching unit 800, and the fourth switching unit 800 feedbacks the DC voltage and then inputs the fedback DC voltage into the first filter 902 and the second filter 912 in a certain period (S130). The DC voltage transmitted in a certain period is averaged by the first filter 901 and the second filter 902 while the periodicity is removed (S140).

Thereafter, the first comparator 903 and the second comparator 913 compare the first reference voltage (Vref_I) and the second reference voltage (Vref_Q) where the amount of carrier feedthrough is the minimum with fedback signals that are averaged (S150). Further, the first integrator 904 and the second integrator 914 generate control voltages by integrating the compared results and output the generated control voltages into the first differential amplifier 200 and the second differential amplifier 210, respectively, such that converted control voltages are applied (S160).

If the fedback signals do not agree with the reference voltage, the first integrator 904 and the second integrator 914 repeat the steps S110 to S160. However, if the fedback signals agree with the first reference voltage (Vref_I) and the second reference voltage (Vref_Q), respectively, it is determined that the amount of the carrier feedthrough is the minimum, such that the fifth switching unit 902 and the sixth switching unit 912 are connected by inputting an off-state compensation signal, and the third switching unit 700 is opened such that the carrier is not input (S180).

The first control voltage and the second control voltage generated by the first integrator 904 and the second integrator 914 are applied to the first differential amplifier 200 and the second differential amplifier 210. Thereafter, differences between the control voltages and the bias voltages input to the first differential amplifier 200 and the second differential amplifier 210 are adjusted such that the carrier feedthrough becomes the minimum. As described above, the steps S110 to S160 are repeated until the carrier feedthrough reaches the minimum level. The first reference voltage (Vref_I) and the second reference voltage (Vref_Q) are changed depending on characteristics of the quadrature modulator in the system.

Next, in step S170, when it is determined that the carrier feedthrough signal with respect to the in-phase/quadrature-phase path converges to the level of the reference voltage and the amount of carrier feedthrough becomes the minimum, the off-state compensation control signal is input, such that the fifth switching unit 902 and the sixth switching unit 912 are each connected. Further, the third switching unit 700 is opened and applies the same reference voltage to two input terminals of each of the first comparator 903 and the second comparator 913 (S190).

In this case, the same signals may be predetermined signals. Applying the same reference voltage to two input terminals of each comparator is for generating, as outputs, pulses showing that the comparators have the same positive/negative levels by inputting the same signals to the first comparator 903 and the second comparator 913. This is for allowing the first integrator 904 and the second integrator 914, which have received a pulse, to constant control voltages that are not changed from the existing output control voltages.

Therefore, pulses showing that the reference voltage and the DC voltage have the same positive/negative level are generated as the outputs of the first comparator 903 and the second comparator 913 (S200). This means that there is no difference between the reference voltage and the DC voltage, that is, there is no carrier feedthrough. In this case, the off-state compensation control signal is input and the in-phase/quadrature-phase baseband signal is input to the system.

In other words, when there is a carrier feedthrough signal, the first comparator 903 and the second comparator 913 generate pulses corresponding to positive or negative levels to show how much difference is between the amount of carrier feedthrough signal and the reference voltage, and the integrators generate control voltages by integrating the outputs of the comparators. However, when there is no carrier feedthrough, the first comparator 903 and the second comparator 913 generate pulses that show they have the same positive/negative levels.

The first integrator 904 and the second integrator 914 integrate the outputs of the first comparator 903 and the second comparator 913 and output the integrated results, and accordingly, predetermined control voltages are applied to the first differential amplifier 200 and the second differential amplifier 210 (S210). This is for transmitting the predetermined control voltages that are applied to the first differential amplifier 200 and the second differential amplifier 210 to the quadrature modulator 300.

A quadrature modulation system having a quadrature-phase signal and an in-phase signal was described in the exemplary embodiment of the present invention, but the invention is not limited thereto.

According to the present invention, it is possible to suppress carrier feedthrough using a simple analog type apparatus for compensating carrier feedthrough.

Further, it is possible to simply achieve an apparatus for compensating carrier feedthrough using a variety of quadrature modulators that require that a baseband differential input voltage difference is 0 or has a slight voltage error.

The embodiment of the present invention described above is not implemented by only the method and apparatus, but it may be implemented by a program for executing the functions corresponding to the configuration of the exemplary embodiment of the present invention or a recording medium having the program recorded thereon. These implementations can be realized by the ordinary skilled person in the art from the description of the above-described exemplary embodiment.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An apparatus of compensating carrier feedthrough in a quadrature modulation system, comprising:
   a quadrature modulator that outputs carrier feedthrough signals generated by a difference between a first bias voltage and a first control voltage in an in-phase path and a difference between a second bias voltage and a second control voltage in a quadrature-phase;

a coupler that extracts a portion of the carrier feedthrough signals from the quadrature modulator;

a detector that measures an amount of carrier feedthrough by detecting a magnitude of the extracted carrier feedthrough signals and converts the carrier feedthrough signals into a DC signal; and controllers that output the first control voltage and the second control voltage by comparing the output DC signal with a first reference voltage and a second reference voltage, respectively.

2. The apparatus of claim 1, wherein the controller comprises:

a first filter that removes the periodicity of the DC signal and outputs the DC signal;

a second filter that removes the periodicity of the DC signal and outputs the DC signal;

a first comparator that outputs a first compared value by comparing the DC signal with the periodicity removed with the first reference voltage;

a second comparator that outputs a second compared value by comparing the DC signal with the periodicity removed with the second reference voltage;

a first integrator that receives and accumulates the first compared values output from the first comparator, and generates the first control voltage;

a second integrator that receives and accumulates the second compared values output from the second comparator, and generates the second control voltage;

a first switching unit that receives the DC signal with the periodicity removed by the first filter and a compensation control signal, which is a control signal for compensating carrier feedthrough with respect to an in-phase signal and a quadrature-phase signal applied through the in-phase path and the quadrature-phase path, respectively, and applies a first reference voltage to the first comparator on the basis of the DC signal with the periodicity removed by the first filter and the compensation signal; and a second switching unit that receives the DC signal with the periodicity removed by the second filter and a compensation control signal, and applies a second reference voltage to the second comparator on the basis of the signal with the periodicity removed by the second filter and the compensation control signal.

3. The apparatus of claim 1, further comprising a switching unit that alternately provides the DC signal output from the detector to the controllers, in accordance with a predetermined period.

4. The apparatus of claim 3, wherein the switching unit comprises a first switching unit that switches connection of the DC signal from the detector to the controllers; and a second switching unit that outputs the DC signal to the controller in the predetermined period, and outputs information about the amount of carrier feedthrough to the controllers.

5. The apparatus of claim 1, wherein the first control voltage is a voltage needed to adjust a voltage difference between a first DC signal representing an amount of carrier feedthrough generated in the in-phase path and the first reference voltage, and the second control voltage is a voltage needed to adjust a voltage difference between a second DC signal representing an amount of carrier feedthrough in the quadrature-phase path and the second reference voltage.

6. The apparatus of claim 5, wherein the first reference voltage is a control voltage that minimizes the amount of carrier feedthrough in the in-phase path, and the second reference voltage is a control voltage that minimizes the amount of carrier feedthrough in the quadrature-phase.

7. The apparatus of claim 1, further comprising:

a first switching unit that switches a path to receive one of a first input signal and a certain signal in the in-phase path, depending on the state of a compensation control signal;

a second switching unit that switches a path to receive one of a second input signal and a certain signal in the quadrature-phase path, depending on the state of the compensation control signal;

a differential amplifier that transmits the first control voltage and the second control voltage output from the controllers and transmits the first bias voltage and the second bias voltage to the quadrature modulator; and a power amplifier that receives a signal output from the quadrature modulator, amplifies the power of the signal, and outputs the signal.

8. A method of compensating carrier feedthrough in a quadrature modulation system, comprising:

detecting a carrier feedthrough signal with respect to an in-phase path and a quadrature-phase path on the basis of a first bias voltage and a second bias voltage;

determining whether a DC voltage with respect to the detected carrier feedthrough signal agrees with a first reference voltage and a second reference voltage;

switching the path to apply the same reference voltages to comparators while blocking a feedback signal, when the DC voltage agrees with the first reference voltage and the second reference voltage; and generating the first control voltage and the second control voltage using the same reference voltages, and applying the generated first control voltage and second control voltage to a signal in the in-phase path and a signal in the quadrature-phase path, respectively.

9. The method of claim 8, wherein the detecting comprises:

calculating an amount of carrier feedthrough with respect to the carrier feedthrough signal and converting the carrier feedthrough signal into a DC voltage;

alternately outputting the DC voltage in a predetermined period;

outputting one of the DC voltages that are alternately output after removing the periodicity of the DC voltage; and comparing the DC voltage with the periodicity removed with the first reference voltage and the second reference voltage, and generating the first control voltage and the second control voltage from the compared results.

10. The method of claim 8, further comprising:

generating a first control voltage by integrating differences of the first DC voltage that representing an amount of carrier feedthrough in the in-phase path and the first reference voltage, when it is determined that the first DC voltage does not agree with the first reference voltage in the determining; and generating a second control voltage by integrating differences of the second DC voltage that representing an amount of carrier feedthrough in the quadrature-path and the second reference voltage, when it is determined that the second DC voltage does not agree with the second reference voltage.

11. The method of claim 10, wherein the first control voltage is a voltage needed to adjust a voltage difference between the first DC voltage and the first reference voltage, and the second control voltage is a voltage needed to adjust a voltage difference between the second DC voltage and the second reference voltage.

12. The method of claim 11, wherein differences between the first control voltage and the first bias voltage, and the second control voltage and the second bias voltage are set to one of 0 or a predetermined value, on the basis of the first reference voltage and the second reference voltage.

13. An apparatus for compensating carrier feedthrough, comprising:
- a coupler that detects a portion of a carrier feedthrough signal with respect to a certain signal on the basis of a bias voltage;
- a detector that measures an amount of carrier feedthrough by detecting the magnitude of a feedthrough carrier with respect to the carrier feedthrough signal detected by the coupler, and converting the carrier feedthrough signal into a DC signal;
- a controller that compares the DC signal with a predetermined reference voltage and then outputs a control voltage; and
- a differential amplifier that applies the control voltage output from the controller and the bias voltage.

14. The apparatus of claim 13, further comprising:
- a switching unit that switches a path to receive one of an input signal and the certain signal, depending on the state of a compensation control signal;
- a quadrature modulator that receives the control voltage and a certain signal from the differential amplifier and outputs the control voltage and the certain signal into a quadrature modulation signal; and
- a power amplifier that receives the quadrature modulation signal output from the quadrature modulator, amplifies the power of the quadrature modulation signal, and then outputs the quadrature modulation signal.

* * * * *